(12) United States Patent
Kang et al.

(10) Patent No.: US 8,182,301 B2
(45) Date of Patent: May 22, 2012

(54) METHOD OF FABRICATING FLAT PANEL DISPLAY HAVING PAD ELECTRODE

(75) Inventors: Tae-Wook Kang, Yongin-si (KR);
Chang-Su Seo, Yongin-si (KR);
Moon-Hee Park, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/972,079

(22) Filed: Dec. 17, 2010

(65) Prior Publication Data

US 2011/0086451 A1    Apr. 14, 2011

Related U.S. Application Data

(62) Division of application No. 11/258,207, filed on Oct. 26, 2005, now Pat. No. 7,876,039.

(30) Foreign Application Priority Data

Oct. 27, 2004    (KR) ......................... 10-2004-0086354

(51) Int. Cl.
*H01J 9/00*    (2006.01)
(52) U.S. Cl. .......................................... 445/23; 445/25
(58) Field of Classification Search ............... 445/23–25
See application file for complete search history.

(56) References Cited

U.S. PATENT DOCUMENTS

| | | | |
|---|---|---|---|
| 5,731,856 A | 3/1998 | Kim et al. | |
| 6,184,966 B1 | 2/2001 | Fujita et al. | |
| 6,323,931 B1 | 11/2001 | Fujita et al. | |
| 6,353,464 B1 | 3/2002 | Noumi et al. | |
| 6,366,331 B1 | 4/2002 | Sakamoto et al. | |
| 6,515,730 B1 | 2/2003 | Maeda | |
| 6,608,663 B2 | 8/2003 | Sakamoto et al. | |
| 6,760,092 B2 | 7/2004 | Yoo et al. | |
| 7,053,972 B2 | 5/2006 | Lim | |
| 7,248,323 B2 | 7/2007 | Ahn et al. | |
| 7,301,275 B2 | 11/2007 | Iga | |

(Continued)

FOREIGN PATENT DOCUMENTS

CN    1368718    9/2002

(Continued)

OTHER PUBLICATIONS

Non-final Office Action of U.S. Appl. No. 11/258,207, issued on Jan. 6, 2009.

(Continued)

*Primary Examiner* — Joseph L Williams
(74) *Attorney, Agent, or Firm* — H.C. Park & Associates, PLC

(57) ABSTRACT

A flat panel display, and method of fabricating the same, including a substrate having a display portion and a pad that is arranged on the substrate and is electrically coupled with the display portion. The pad includes a pad electrode arranged on the substrate, a passivation layer arranged on the pad electrode and having only one contact hole that exposes the pad electrode, and a transparent electrode arranged on the passivation layer and the pad electrode. The passivation layer may alternatively have a plurality of contact holes that expose the pad electrode. In this case, the reflective layer pattern is arranged on the passivation layer and the pad electrode, and it exposes portions of the pad electrode in the contact holes. Furthermore, the transparent electrode would be arranged on the reflective layer pattern and the exposed portions of the pad electrode.

13 Claims, 4 Drawing Sheets

U.S. PATENT DOCUMENTS

| | | |
|---|---|---|
| 7,586,578 B2 | 9/2009 | Kaneko et al. |
| 7,609,348 B2 | 10/2009 | Nakayama et al. |
| 2002/0051110 A1 | 5/2002 | Kim |
| 2003/0017422 A1 | 1/2003 | Yamaguchi |
| 2003/0151358 A1 | 8/2003 | Iga |
| 2004/0080688 A1 | 4/2004 | Ishida |
| 2004/0141116 A1 | 7/2004 | You |
| 2005/0110023 A1 | 5/2005 | Lee et al. |
| 2008/0088784 A1 | 4/2008 | Nakayama et al. |

FOREIGN PATENT DOCUMENTS

| | | |
|---|---|---|
| CN | 1462899 | 12/2003 |
| CN | 1567609 | 1/2005 |
| JP | 11-307242 | 11/1999 |
| JP | 2001-332740 | 11/2001 |
| JP | 2002-111004 | 4/2002 |
| JP | 2002-214638 | 7/2002 |
| JP | 2002-357844 | 12/2002 |
| JP | 2003-015158 | 1/2003 |
| JP | 2003-131253 | 5/2003 |
| JP | 2004-126597 | 4/2004 |
| JP | 2004-157516 | 6/2004 |
| JP | 2004-184740 | 7/2004 |
| KR | 10-2004-0034081 | 4/2004 |
| WO | 03/058332 | 7/2003 |

OTHER PUBLICATIONS

Final Office Action of U.S. Appl. No. 11/258,207, issued on Aug. 5, 2009.

Chinese Patent Registration Gazette issued on Sep. 2, 2009 in the corresponding Chinese Patent Applicaiton No. 200510118505.9.

Non-final Office Action of U.S. Appl. No. 11/258,207, issued on Dec. 28, 2009.

Non-final Office Action of U.S. Appl. No. 11/258,207, issued on Jun. 7, 2010.

Notice of Allowance of U.S. Appl. No. 11/258,207, issued on Sep. 20, 2010.

METHOD OF FABRICATING FLAT PANEL DISPLAY HAVING PAD ELECTRODE

CROSS-REFERENCE TO RELATED APPLICATION

This application is a divisional of U.S. patent application Ser. No. 11/258,207, filed on Oct. 26, 2005 and claims priority from and the benefit of Korean Patent Application No. 10-2004-0086354, filed on Oct. 27, 2004, which are both hereby incorporated by reference for all purposes as if fully set forth herein.

BACKGROUND OF THE INVENTION

1. Field of the Invention

The present invention relates to a flat panel display (FPD) and method of fabricating the same and, more particularly, to a FPD and method of fabricating the same, which prevent a pad portion from disconnecting from a driver integrated circuit (IC).

2. Discussion of the Background

Generally, cathode ray tubes (CRT), which are typically used for display devices, are often used in monitors for TVs, measuring instruments, and information terminals. However, due to the CRTs' weight and size, it is difficult to utilize them in small, lightweight electronic products.

Hence, compact and lightweight FPDs have attracted much attention as substitutes for the CRT. FPDs include liquid crystal displays (LCD), organic light-emitting displays (OLED), and the like.

A FPD typically includes a thin film transistor (TFT) substrate including TFTs and red (R), green (G), and blue (B) light emitting diodes (LEDs).

A pad portion, which receives an external signal, is arranged at the periphery of the FPD. The pad portion is connected to a driver IC that generates a scanning or signal voltage. In order to electrically connect the pad portion to the driver IC, a bonding process may be performed using a conductive film, such as an anisotropic conductive film (ACF).

Hereinafter, a conventional OLED will be described with reference to FIG. 1, FIG. 2A, FIG. 2B, FIG. 3A, and FIG. 3B.

FIG. 1 is a cross-sectional view of a conventional OLED. Referring to FIG. 1, the OLED includes an OLED portion 20, a pad portion 30, and an encapsulation substrate 40. The OLED portion 20 is arranged on a transparent insulating substrate 10. The pad portion 30 includes an external circuit module that is connected to the OLED portion 20. The encapsulation substrate 40 is coupled with the transparent insulating substrate 10 using a sealant 50. The OLED portion 20 includes an organic light emitting diode, a TFT, a capacitor, and conductive lines such as a gate line and a data line. The organic light emitting diode includes a first electrode, a second electrode, and an emission layer arranged between the first and second electrodes. In a pixel, the organic light emitting diode is connected to the TFT and the capacitor, and each pixel includes conductive lines such as the gate line and data line. The pad portion 30 electrically connects the OLED portion 20 to an external driver IC.

FIG. 2A is a photograph of a pad portion of a conventional FPD, FIG. 2B is a plan view of a portion "a" of FIG. 2A, and FIG. 3A and FIG. 3B are cross-sectional views taken along line A-A' of FIG. 2B, which show exemplary process operations.

First, the pad portion is arranged at the periphery of an OLED portion and simultaneously formed with the OLED portion.

While forming source and drain electrodes in a TFT region of a transparent insulating substrate 100, a pad electrode 110 is formed on the pad portion. Here, the pad electrode 110 may be formed of molybdenum (Mo) or molybdenum tungsten (MoW).

Thereafter, a passivation layer 120 is formed on the pad portion when forming a passivation layer on the TFT region.

Subsequently, while forming a via contact hole in the TFT region to expose either the source or drain electrode of the TFTs, a plurality of contact holes 122 is formed in the passivation layer 120 to expose the pad electrode 110 of the pad portion.

A reflective layer 130 is then formed on the entire surface of the resultant structure. The reflective layer 130 may be formed of an aluminum or aluminum alloy layer.

The reflective layer 130 is then selectively removed such that it remains only on an emission region of the OLED portion. Since a contact resistance between the is reflective layer 130 and a subsequently formed transparent electrode may increase, it may be desirable to remove the reflective layer 130 from the via contact hole in addition to the pad portion. As FIG. 3B shows, when removing the reflective layer 130, the pad electrode 110 of the pad portion is also removed to a predetermined thickness, thereby forming an undercut 112 under the passivation layer 120.

Next, a transparent metal layer is formed on the entire surface of the resultant structure, followed by photolithography and etching processes, thereby forming a transparent electrode 140 on the emission region of the OLED portion and the pad portion. Here, the transparent electrode 140 formed on the pad portion may be electrically disconnected at the undercut 112 under the passivation layer 120.

The pad portion and a driver IC (not shown) are then connected to a connector, such as a flexible printed circuit (FPC) or a chip on glass (COG). The pad portion may be connected to the connector using an ACF containing conductive particles.

As described above, in a conventional FPD, the pad portion may be directly bonded to the driver IC using a COG process, which provides for smaller devices and lower production cost. However, because the contact holes formed in the pad portion typically have a very fine size of 4 to 10 μm, when the conductive particles with 5 to several tens of μm are not filled in the contact hole, the conductive particles are not connected to the pad electrode formed in the contact hole so that they are electrically disconnected. Also, when the ACF is formed on the transparent electrode disposed on the contact hole, it may be disconnected from the pad electrode due to the undercut formed at the edge of the contact hole. Thus, the OLED portion may not be electrically connected to an external module. Consequently, the contact resistance of to the pad portion increases, and the electrical characteristics of the OLED deteriorate.

SUMMARY OF THE INVENTION

The present invention provides a flat panel display (FPD) and method of fabricating the same, in which a sufficient contact region is formed on a pad portion to prevent an organic light emitting display (OLED) portion from being disconnected from an external is circuit.

Additional features of the invention will be set forth in the description which follows, and in part will be apparent from the description, or may be learned by practice of the invention.

The present invention discloses a FPD including a substrate having a display 20 portion and a pad that is arranged on the substrate and is electrically coupled with the display portion. The pad includes a pad electrode arranged on the substrate, a passivation layer arranged on the pad electrode and having only one contact hole that exposes the pad electrode, and a transparent electrode arranged on the passivation layer and the pad electrode.

The present invention also discloses a FPD that includes a substrate having a display portion and a pad that is arranged on the substrate and is electrically coupled with the display portion. The pad includes a pad electrode arranged on the substrate, a passivation layer arranged on the pad electrode and having a plurality of contact holes that expose the pad electrode, a reflective layer pattern arranged on the passivation layer and the pad electrode, the reflective layer pattern exposing portions of the pad electrode in the contact holes, and a transparent electrode arranged on the reflective layer pattern and the exposed portions of the pad electrode.

The present invention also discloses a method of fabricating a flat panel display comprising a pad that is arranged on a substrate having a display portion and is electrically coupled with the display portion. The method includes forming a pad electrode on the substrate, forming a passivation layer on the pad electrode, forming only one contact hole in the passivation layer to expose the pad electrode, forming a reflective layer on the resultant structure, removing the reflective layer, and forming a transparent electrode on the resultant structure.

The present invention also discloses a method of fabricating a flat panel display comprising a pad that is arranged on a substrate having a display portion and is electrically coupled with the display portion. The method includes forming a pad electrode on the substrate, forming a passivation layer on the pad electrode, forming a plurality of contact holes in the passivation layer to expose the pad electrode, forming a reflective layer on the resultant structure, removing portions of the reflective layer such that the pad electrode is exposed in the contact holes and the reflective layer overlaps a portion of the pad electrode in the contact holes, and forming a transparent electrode on the resultant structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
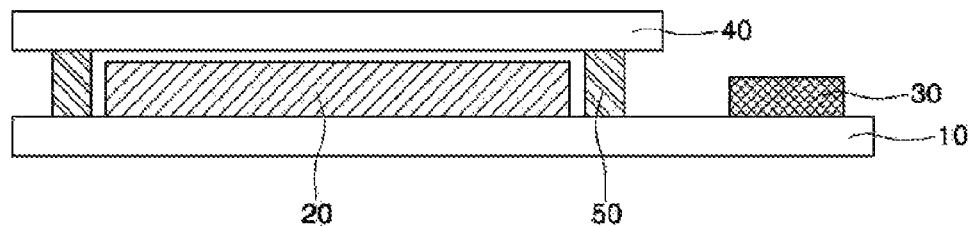
FIG. 1 is a cross-sectional view of a conventional organic light emitting display (OLED).
Figure 2A:
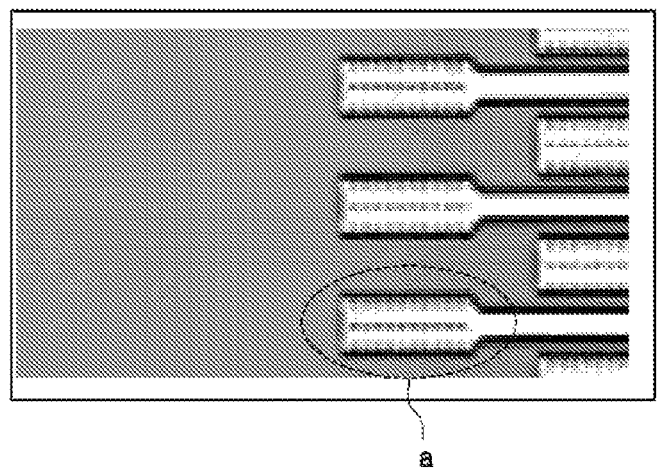
FIG. 2A is a photograph of a pad portion of a conventional flat panel display (FPD).
Figure 2B:
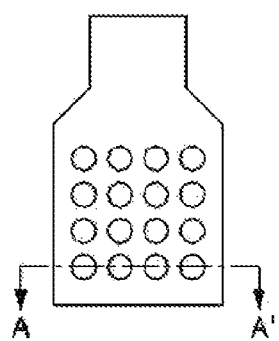
FIG. 2B is a plan view of portion "a" of FIG. 2A.
Figure 3A:
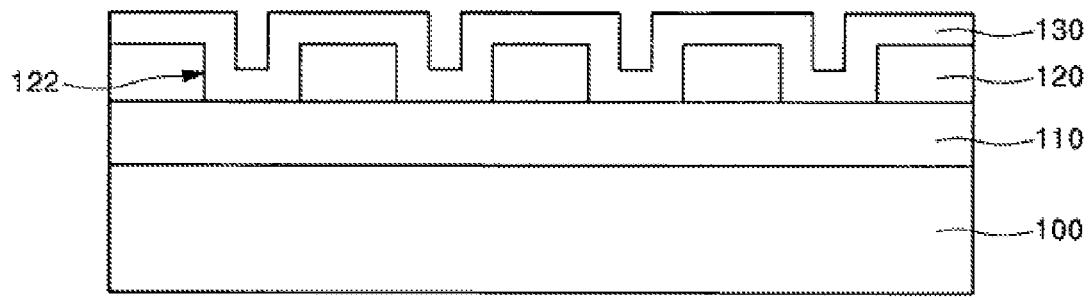
FIG. 3A and FIG. 3B are cross-sectional views taken along line A-A' of FIG. 2B.
Figure 3B:
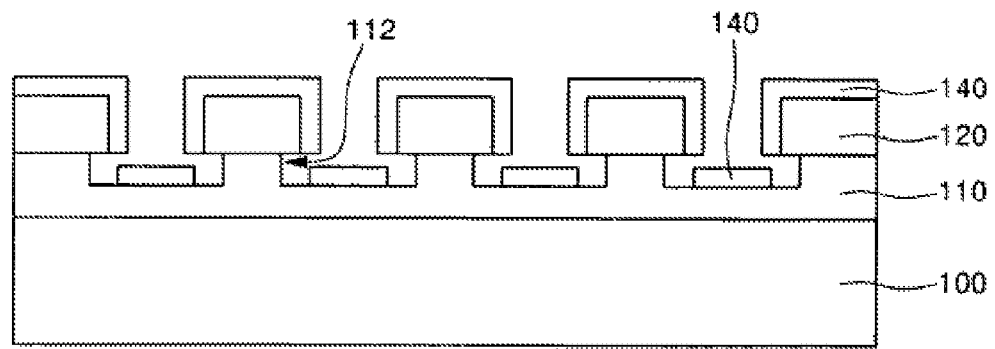

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 4:
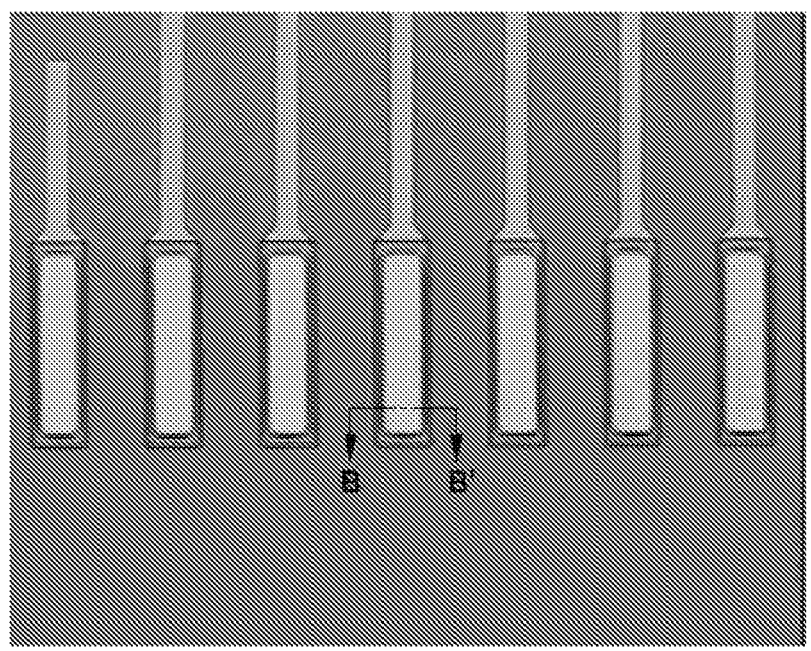
FIG. 4 is a photograph of a pad portion of an FPD according to an exemplary embodiment of the present invention.
Figure 5A:
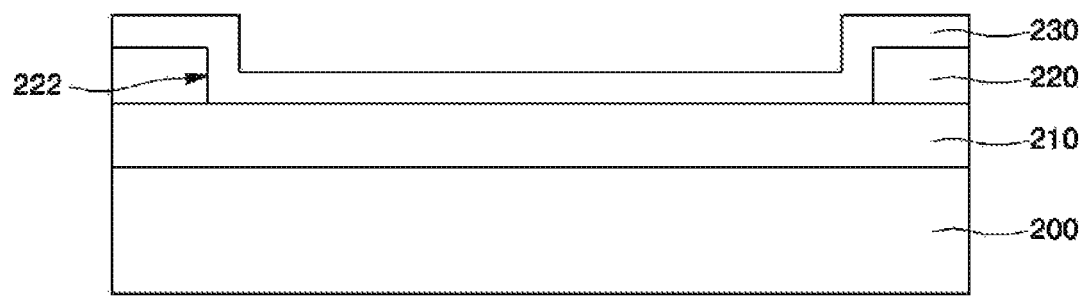
FIG. 5A and FIG. 5B are cross-sectional views taken along line B-B' of FIG. 4.
Figure 5B:
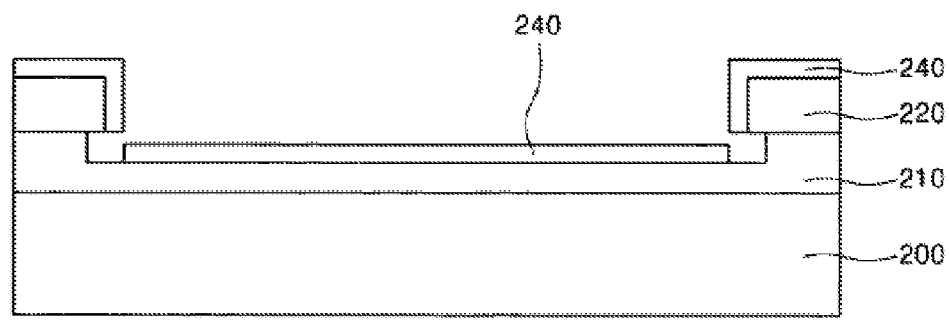

FIG. 4 is a photograph of a pad portion of a flat panel display (FPD) according to an exemplary embodiment of the present invention, and FIG. 5A and FIG. 5B, which show exemplary process operations, are cross-sectional views taken along line B-B' of FIG. 4.

The pad portion may be arranged on a transparent insulating substrate that includes an organic light emitting display (OLED) portion. The pad portion couples the OLED portion with a driver integrated circuit (IC).

The pad portion may be simultaneously formed with the OLED portion. Hereinafter, a method of forming the pad portion will be described.

At the outset, a pad electrode 210 may be formed on a transparent insulating substrate 200. The pad electrode 210 may be simultaneously formed with source and drain electrodes for the OLED portion. The pad electrode 210 may be formed of molybdenum (Mo) or molybdenum tungsten (MoW).

Next, a passivation layer 220 may be formed on the entire surface of the resultant structure. The passivation layer 220 may include at least one layer selected from the group consisting of a silicon oxide layer, a silicon nitride layer, and a silicon oxynitride layer.

Photolithography and etching processes may then be performed on the passivation layer 220, thereby forming a contact hole 222 that exposes the pad electrode 210. In this case, only one contact hole 222 is formed in each pad.

Next, a reflective layer 230 may be formed on the entire surface of the resultant structure. The reflective layer 230 may be formed of aluminum or an aluminum alloy.

The reflective layer 230 may be selectively removed using photolithography and etching processes. In this case, the reflective layer 230 remains only in an emission region of the OLED portion. The reflective layer 230 may be removed to prevent an increase of contact resistance between the OLED portion and the pad portion. When removing the reflective layer 230, a portion of the pad electrode 210 is also removed to a predetermined thickness, thereby forming an undercut under the passivation layer 220.

A transparent electrode 240 may then be formed on the entire surface of the resultant structure, thereby completing the pad portion.

After completing the pad portion, a connector, such as a COG or FPC, may be coupled with the pad portion using an ACF. In this case, even if the transparent electrode 240 is disconnected due to the undercut formed at the edge of the contact hole 222, conductive particles contained in the ACF may contact the pad electrode 210 because the contact hole 222 has a sufficient size. Therefore, the pad portion may be electrically coupled with the connector.

Figure 6:
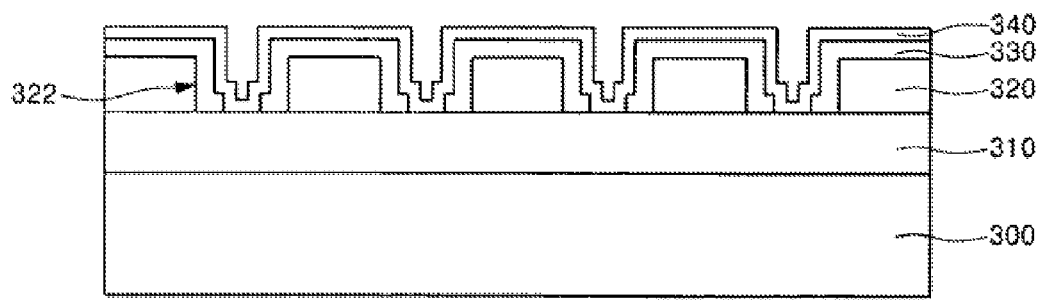
FIG. 6 is a cross-sectional view of a pad of an FPD according to another exemplary embodiment of the present invention.

FIG. 6 is a cross-sectional view of a pad of an FPD according to another exemplary embodiment of the present invention.

Referring to FIG. 6, a pad electrode 310 and a passivation layer 320 may be formed on a transparent insulating substrate 300, and the passivation layer 320 is etched using photolithography and etching processes, thereby forming a plurality of contact holes 322 to expose the pad electrode 310. In this case, the pad electrode 310 may be simultaneously formed with source and drain electrodes for an OLED portion. The pad electrode 310 may be formed of Mo or MoW.

Next, a reflective layer 330 may be formed on the entire surface of the resultant structure. The reflective layer 330 may be formed of aluminum or an aluminum alloy.

The reflective layer 330 may then be etched using photolithography and etching processes, thereby exposing a portion of the pad electrode 310 exposed by the contact hole 322. In this case, the reflective layer 330 is formed to overlap a portion of the pad electrode 310 exposed by the contact hole 322.

A transparent electrode 340 may then be formed on the entire surface of the resultant structure, thereby completing the pad portion. In this case, the transparent electrode 340 is coupled with not only a top surface of the reflective layer 330 but also a portion of the pad electrode 310 that is exposed by the contact hole 322.

Subsequently, a connector, such as a COG or FPC, is coupled with the pad portion using an ACF. In this case, since the reflective layer 330 overlaps a portion of the pad electrode 310 exposed by the contact hole 322, even if conductive particles contained in the ACF are not filled in the contact hole 322, the pad portion may be electrically coupled with the connector.

According to exemplary embodiments of the present invention as described above, a sufficient contact region may be formed on a pad portion of an FPD, thereby preventing electrical disconnection of the pad portion from a connector, as well as an increase of contact resistance therebetween. Consequently, the FPD may have improved electrical properties, and its yield can be increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a flat panel display comprising a substrate having a display portion and a pad arranged on the substrate and electrically coupled with the display portion, the method comprising:
   forming a pad electrode on the substrate;
   forming a passivation layer on the pad electrode;
   forming one contact hole in the passivation layer to expose the pad electrode;
   forming a reflective layer on the resultant structure;
   removing the entire reflective layer disposed in the contact hole; and
   forming a transparent electrode on the resultant structure.

2. The method of claim 1, wherein the pad electrode comprises one of molybdenum and molybdenum tungsten.

3. The method of claim 1, further comprising forming an undercut at an edge of the contact hole.

4. The method of claim 1, wherein the passivation layer comprises at least one layer selected from the group consisting of a silicon oxide layer, a silicon nitride layer, and a silicon oxynitride layer.

5. The method of claim 1, wherein the display is one of an organic light emitting display and a liquid crystal display.

6. A method of fabricating a flat panel display comprising a substrate having a display portion and a pad arranged on the substrate and electrically coupled with the display portion, the method comprising:
   forming a pad electrode on the substrate;
   forming a passivation layer on the pad electrode;
   forming a plurality of contact holes in the passivation layer to expose the pad electrode;
   forming a reflective layer on the resultant structure;
   removing portions of the reflective layer such that the pad electrode is exposed in the contact holes and the reflective layer overlaps a portion of the pad electrode in the contact holes; and
   forming a transparent electrode on the resultant structure.

7. The method of claim 6, wherein the pad electrode comprises one of molybdenum and molybdenum tungsten.

8. The method of claim 6, wherein the passivation layer comprises at least one layer selected from the group consisting of a silicon oxide layer, a silicon nitride layer, and a silicon oxynitride layer.

9. The method of claim 6, wherein the reflective layer comprises one of aluminum and an aluminum alloy.

10. The method of claim 6, wherein the display is one of an organic light emitting display and a liquid crystal display.

11. The method of claim 3, wherein the undercut is formed by removing a portion of the pad electrode.

12. The method of claim 1, wherein the transparent electrode contacts the pad electrode and the passivation layer.

13. The method of claim 6, wherein the transparent electrode contacts the pad electrode and the reflective layer.

* * * * *